US009040895B2

(12) United States Patent
Kawabata et al.

(10) Patent No.: US 9,040,895 B2
(45) Date of Patent: May 26, 2015

(54) PHOTOELECTRIC CONVERSION APPARATUS AND IMAGING SYSTEM USING THE SAME

(71) Applicant: CANON KABUSHIKI KAISHA, Tokyo (JP)

(72) Inventors: Yasuhiro Kawabata, Kawasaki (JP); Hideaki Takada, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 13/942,346

(22) Filed: Jul. 15, 2013

(65) Prior Publication Data

US 2013/0300903 A1   Nov. 14, 2013

Related U.S. Application Data

(62) Division of application No. 12/885,677, filed on Sep. 20, 2010, now Pat. No. 8,519,316.

(30) Foreign Application Priority Data

Sep. 24, 2009 (JP) .................................. 2009-219218
Aug. 20, 2010 (JP) .................................. 2010-185290

(51) Int. Cl.
  *H01L 27/00* (2006.01)
  *H01J 40/14* (2006.01)
  (Continued)

(52) U.S. Cl.
  CPC ...... *H01L 27/14607* (2013.01); *H01L 27/1463* (2013.01); *H01L 27/14689* (2013.01); *H04N 5/335* (2013.01)

(58) Field of Classification Search
  USPC .......................... 250/208.1, 214 R, 214.1, 329;
  348/207.99, 266, 272, 281, 282, 283,
  348/294, 297–299, 302–311, 316,
  348/320–324; 257/225, 226, 256–258, 414,
  257/431, 441–444, 451, 461–464;
  438/57–63, 66, 38, 73–81, 128, 144,
  438/145
  See application file for complete search history.

(56) References Cited

U.S. PATENT DOCUMENTS 5,789,774 A   8/1998   Merrill ........................... 257/292
5,841,176 A   11/1998  Merrill ........................... 257/446
(Continued)

FOREIGN PATENT DOCUMENTS

CN   1691345 A     11/2005
JP   2003-069005 A  3/2003
(Continued)

OTHER PUBLICATIONS

State Intellectual Property Office of the People's Republic of China, Office Action dated Mar. 31, 2012, in connection with Application No. 201010288433.3, 4 pages (and English translation thereof).

(Continued)

*Primary Examiner* — Pascal M Bui Pho
(74) *Attorney, Agent, or Firm* — Fitzpatrick, Cella, Harper & Scinto

(57) ABSTRACT

A photoelectric conversion apparatus of the present invention includes a first semiconductor region functioning as a barrier against signal charges between a first and a second photoelectric conversion element, and a second semiconductor region that has a width narrower than that of the first semiconductor region and functions as a barrier against signal charges between a first and the third photoelectric conversion element. A region with a low barrier is provided at least a part between the first and the second photoelectric conversion element.

28 Claims, 11 Drawing Sheets

(51) Int. Cl.
*H01L 27/146* (2006.01)
*H04N 5/335* (2011.01)

(56) References Cited

U.S. PATENT DOCUMENTS

| | | | |
|---|---|---|---|
| 7,157,754 B2 | 1/2007 | Nagasaki et al. | |
| 7,187,052 B2 | 3/2007 | Okita et al. | 257/444 |
| 7,283,305 B2 | 10/2007 | Okita et al. | 359/619 |
| 7,456,888 B2 | 11/2008 | Kikuchi | |
| 7,538,804 B2 | 5/2009 | Okita et al. | 348/241 |
| 7,557,846 B2 | 7/2009 | Ohkawa | 348/302 |
| 7,557,847 B2 | 7/2009 | Okita et al. | 348/308 |
| 7,605,415 B2 | 10/2009 | Koizumi et al. | 257/291 |
| 7,629,568 B2 | 12/2009 | Koizumi et al. | 250/214 R |
| 8,164,042 B2 * | 4/2012 | Tseng et al. | 250/226 |
| 2003/0085399 A1 | 5/2003 | Inagaki | 257/53 |
| 2003/0209712 A1 | 11/2003 | Fujita et al. | 257/72 |
| 2005/0174552 A1 | 8/2005 | Takada et al. | 355/53 |
| 2005/0237405 A1 | 10/2005 | Ohkawa | 348/308 |
| 2005/0269604 A1 | 12/2005 | Koizumi et al. | 257/291 |
| 2006/0043440 A1 | 3/2006 | Hiyama et al. | 257/291 |
| 2006/0044434 A1 | 3/2006 | Okita et al. | 348/294 |
| 2006/0103750 A1 | 5/2006 | Iwamoto | 348/311 |
| 2007/0114627 A1 | 5/2007 | Roy et al. | 257/431 |
| 2007/0114629 A1 | 5/2007 | Dosluoglu et al. | 257/435 |
| 2008/0062294 A1 | 3/2008 | Koizumi et al. | 348/300 |
| 2009/0098679 A1 * | 4/2009 | Abe et al. | 438/80 |
| 2009/0213256 A1 | 8/2009 | Kudoh | 348/302 |
| 2009/0218479 A1 | 9/2009 | Arishima et al. | 250/226 |
| 2009/0237543 A1 | 9/2009 | Hatano et al. | 348/308 |
| 2010/0025570 A1 | 2/2010 | Koizumi et al. | 250/208.1 |
| 2010/0060762 A1 | 3/2010 | Takada et al. | 348/300 |
| 2011/0068253 A1 | 3/2011 | Arishima et al. | 250/208.1 |

FOREIGN PATENT DOCUMENTS

| | | |
|---|---|---|
| JP | 2003-258232 A | 9/2003 |
| JP | 2004-186408 A | 7/2004 |
| JP | 2004-266159 A | 9/2004 |
| JP | 2006-024907 A | 1/2006 |
| JP | 2008-084962 A | 4/2008 |

OTHER PUBLICATIONS

U.S. Patent and Trademark Office, Office Action dated Oct. 16, 2012, in connection with U.S. Appl. No. 12/885,683, 8 pages.
Extended European Search Report dated May 2, 2013, issued in counterpart European Patent Application No. 10178774.5.

* cited by examiner

PHOTOELECTRIC CONVERSION APPARATUS AND IMAGING SYSTEM USING THE SAME

CROSS REFERENCE TO RELATED APPLICATIONS

This application is a division of U.S. application Ser. No. 12/885,677, filed Sep. 20, 2010, the entire disclosure of which is hereby incorporated herein by reference.

BACKGROUND OF THE INVENTION

1. Field of the Invention

The present application relates to a structure of separation of a photoelectric conversion apparatus.

2. Description of the Related Art

CCD type and CMOS type photoelectric conversion apparatuses are used for many digital cameras and digital camcorders. In recent years, in the photoelectric conversion apparatuses, pixels have been reduced. Accordingly, measures against mixing of charges to adjacent pixels (crosstalk) have been discussed.

Japanese Patent Application Laid-Open No. 2003-258232 discusses a configuration where a P type well region, which functions as an element isolation barrier to prevent charges from mixing between adjacent pixels, is formed in a deep region consistent with an N type well region of a photoelectric conversion element.

However, even with the P type well region disclosed in Japanese Patent Application Laid-Open No. 2003-258232, it may be difficult to sufficiently suppress carrier leakage. In general, in the photoelectric conversion apparatus, a transistor for reading charges from a photoelectric conversion element is provided around the photoelectric conversion element. It is not necessary that the photoelectric conversion elements are arranged at regular intervals. Further, the widths of P type well separating the photoelectric conversion elements may be different. Accordingly, the inventors of the present invention have found out that an amount of signal charge leaking from a certain photoelectric conversion element to the adjacent photoelectric conversion elements may vary according to the width of such a P type well region. If the amount of carrier leakage to the adjacent photoelectric conversion elements varies, image quality is degraded and correction by signal processing becomes difficult. If intervals between the photoelectric conversion elements are made to be equalized and the widths of the P type well regions are also made to be equalized, a degree of freedom of planar layout of transistors for reading signal charges is decreased and reduction of pixels becomes difficult.

It is an object of the present invention to provide a photoelectric conversion apparatus capable of reducing variation in charges mixing into the adjacent photoelectric conversion elements (pixels).

SUMMARY OF THE INVENTION

A photoelectric conversion apparatus according to the present invention includes: a substrate; a plurality of photoelectric conversion elements arranged on the substrate; and a transistor arranged on the substrate for transferring a signal charge generated by the photoelectric conversion element, wherein the plurality of photoelectric conversion elements include a first photoelectric conversion element, a second photoelectric conversion element adjacent to the first photoelectric conversion element and a third photoelectric conversion element adjacent to the first photoelectric conversion element, and a first region having a first width is arranged between the first and second photoelectric conversion elements, a second region having a second width narrower than the first width is arranged between the first and third photoelectric conversion elements, a first semiconductor region of a first conductivity type such that the signal charge is minority carrier and of a third width is arranged in the first region, a second semiconductor region of the first conductivity type and of a fourth width narrower than the third width is arranged in the second region, and a third region at a potential as to the signal charge lower than first region is arranged in the first region.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

A photoelectric conversion apparatus of the present invention includes a first semiconductor region, which functions as a barrier against signal charges, between a first and a second photoelectric conversion element; and a second semiconductor region, which functions as a barrier against signal charges and is narrower than the first semiconductor region, between the first and a third photoelectric conversion element. Further, a region with a low barrier (potential barrier) is provided at least a part between the first and the second photoelectric conversion element. This configuration can suppress that signal charges generated in the first photoelectric conversion element are unevenly mixed into the adjacent second and third photoelectric conversion elements. That is, the amount of signal charge mixing into the adjacent photoelectric conversion elements can be equalized, thereby improving image quality to be acquired. Further, when correction is made, an image signal can easily be corrected. Accordingly, a necessary configuration of an image processor can be simplified.

An embodiment of the present invention is hereinafter described in detail using the figures.

(Example of Pixel Circuit)

Figure 2A:
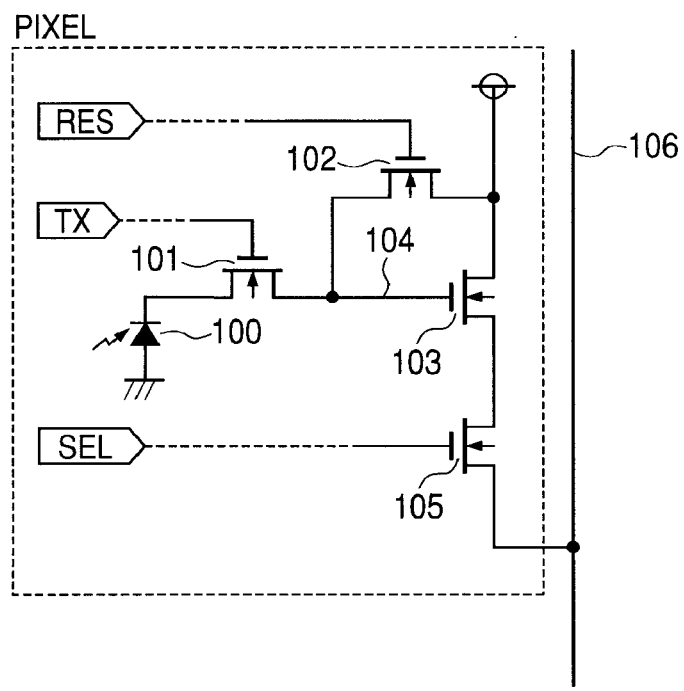
FIG. 2A illustrates an example of a pixel circuit of the photoelectric conversion apparatus.
Figure 2B:
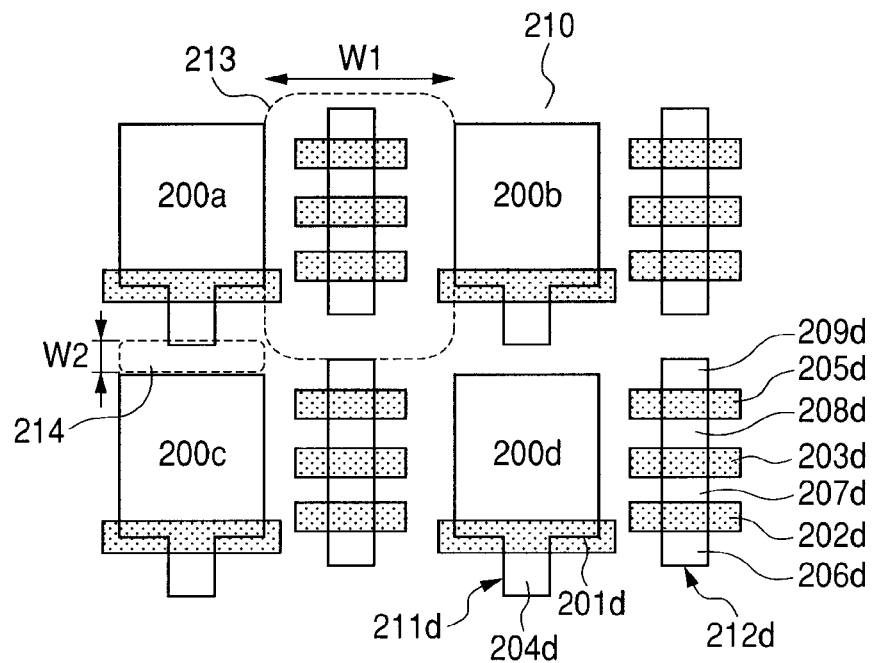
FIG. 2B is a plan view of the pixel circuit of the photoelectric conversion apparatus.

An example of a pixel circuit to which the present invention can be applied is described. FIG. 2A is a circuit diagram of an example of the pixel circuit to which the present invention can be applied. FIG. 2B is a plan view illustrating a planar layout of the pixel circuit for four pixels. A case where the signal charge is of electrons is described below.

In FIG. 2A, a pixel (PIXEL) includes a photodiode 100, which is a photoelectric conversion element; a transferring MOS transistor 101; a reset MOS transistor 102; an amplifying MOS transistor 103; and a selection MOS transistor 105. The transferring MOS transistor 101 transfers signal charges generated in the photoelectric conversion element 100 to a floating diffusion region 104. The amplifying MOS transistor 103 outputs an output according to a potential of the floating diffusion region 104 to output line 106 via the selection MOS transistor 105. The amplifying MOS transistor 103 is a part of a source follower circuit. The gate electrode thereof is connected to the floating diffusion region 104. The reset MOS transistor 102 resets a node of the gate electrode of the amplifying MOS transistor 103, i.e. the floating diffusion region 104, to a prescribed potential (reset potential). The transferring MOS transistor 101 is supplied with a transfer control signal TX. The reset MOS transistor 102 is supplied with a reset control signal RES. The selection MOS transistor 105 is supplied with a selection control signal SEL. Each control signal controls the readout of the signal charge. In the photoelectric conversion apparatus, such pixels are arranged one-dimensionally or two-dimensionally. This arrangement configures an imaging region.

FIG. 2B illustrates a planar layout of four pixels (pixels a to d). In FIG. 2B, four photodiodes 200 are arranged. A gate electrode 201 is of the transferring MOS transistor 101. A gate electrode 202 is of the reset MOS transistor 102. A gate electrode 203 is of the amplifying MOS transistor 103. A gate electrode 205 is of the selection MOS transistor 105. There is a floating diffusion region 204. Further, a source region 206 is of the reset MOS transistor. A drain region 207 is of the reset MOS transistor and of the amplifying MOS transistor. A source region 208 is of the amplifying MOS transistor, and is also a drain region of the selection MOS transistor. A source region 209, which is of the selection MOS transistor, is connected to the output line 106. Hereinafter, for the sake of description, the photoelectric conversion elements 200 in FIG. 2B are referred to as a first photoelectric conversion element 200a, a second photoelectric conversion element 200b, a third photoelectric conversion element 200c and a fourth photoelectric conversion element 200d. In a configuration other than that of the photoelectric conversion element, symbols are assigned only to the pixel d. For example, the gate electrode of the transferring MOS transistor corresponding to the photoelectric conversion element 200d is represented with reference numeral 201d. Since configurations are identical among other pixels, symbols are omitted.

An element isolation region 210 defines active regions 211 and 212. In this embodiment, a LOCOS (local oxidation of silicon) structure is used for the element isolation region 210 of the elements. However, the structure may be STI (shallow trench isolation) structure instead. Further, the element isolation region 210 may be a structure where only a semiconductor region functioning as a barrier against a signal charge is arranged (diffusion isolation). If the element isolation region 210 includes only the semiconductor region functioning as the barrier against the signal charges, the active region is defined at a boundary with the semiconductor region functioning as the barrier against the signal charge. In FIG. 2B, the active region 211 includes the photoelectric conversion element 200 and a floating diffusion region 204. The active region 212 includes the source region and the drain region of each transistor. Here, in FIG. 2B, a distance between the active region 211a where the photoelectric conversion element 200a is arranged and the active region 211b where the photoelectric conversion element 200b is arranged, or the width of a first region 213 between the photoelectric conversion elements 200a and 200b is represented as a first width W1. A distance between the active region 211a where the photoelectric conversion element 200a is arranged and the active region 211c where the photoelectric conversion element 200c is arranged, or the width of a second region 214 between the photoelectric conversion elements 200a and 200c is represented as a second width W2. The first width W1 and the second width W2 are different from each other, and W1>W2. Here, the pixels are arranged in a matrix manner along a first direction (X axis) and a second direction (Y axis). The first and second directions are orthogonal to each other.

The photoelectric conversion apparatus is not limited to the circuit as illustrated in FIG. 2A. The apparatus may be a configuration where a larger number of photoelectric conversion elements share the amplifying MOS transistor, or a configuration without the selection MOS transistor. Further, the configuration is not limited to the planar layout as illustrated in FIG. 2B. Exemplary embodiments of the present invention are hereinafter described using the figures.

First Exemplary Embodiment

Figure 1A:
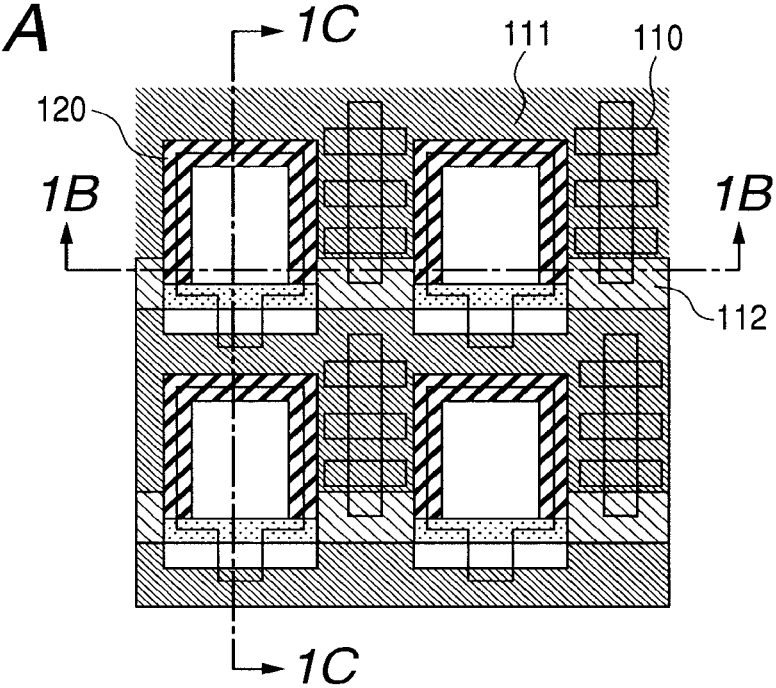
FIG. 1A is a plan view of a photoelectric conversion apparatus of a first exemplary embodiment.

A photoelectric conversion apparatus of this exemplary embodiment is described using FIGS. 1A to 1G. First, FIG. 1A is a plan view corresponding to the plan view of FIG. 2B. In FIG. 1A, symbols for elements similar to those of FIG. 2B are omitted. Symbols are assigned only to parts characterizing this exemplary embodiment. In FIG. 1A, there are arranged a first semiconductor region 110 and a second semiconductor region 111. The regions 110 and 111 are a first conductive type (P type), where signal charges become a minority carrier, and configure barriers against the signal charges (electrons). More specifically, the first semiconductor region 110 with a third width W3 is arranged in the first region 213. The second semiconductor region 111 with a fourth width W4 is arranged in the second region 214. These arrangements form potential barriers.

The first semiconductor region 110 is arranged under an active region 211 where a transistor is arranged. A third semiconductor region 112 is arranged at a part of the first region 213. The region 112 is the first conductive type with the third width W3. The third semiconductor region 112 has a potential lower than a potential of the first semiconductor region 110. Because, an impurity concentration of the third semiconductor region 112 is lower than that of the first semiconductor region 110. More specifically, the third semiconductor region 112 is arranged under the source region 206 of the reset MOS transistor. The first to third semiconductor regions form a grid-like potential barrier surrounding the photoelectric conversion element. Here, the amount of charge flowing from the photoelectric conversion element 200a into the photoelectric conversion elements 200b and 200c can be equalized, by arranging the third semiconductor region 112, while the charge flowing from the photoelectric conversion element 200a into the adjacent photoelectric conversion elements is suppressed.

Figure 1B:
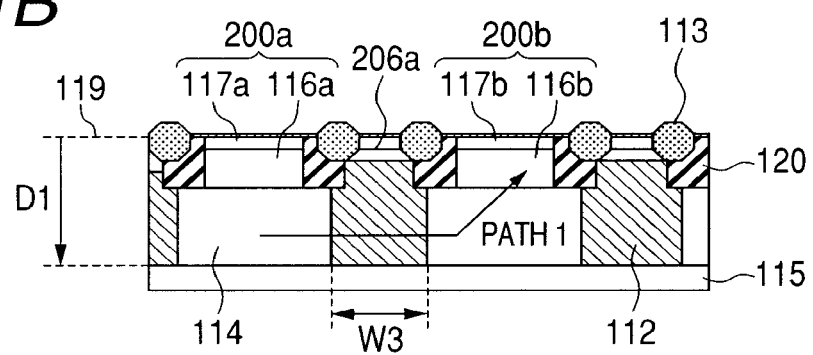
FIG. 1B is a schematic sectional view of the photoelectric conversion apparatus of the first exemplary embodiment.
Figure 1C:
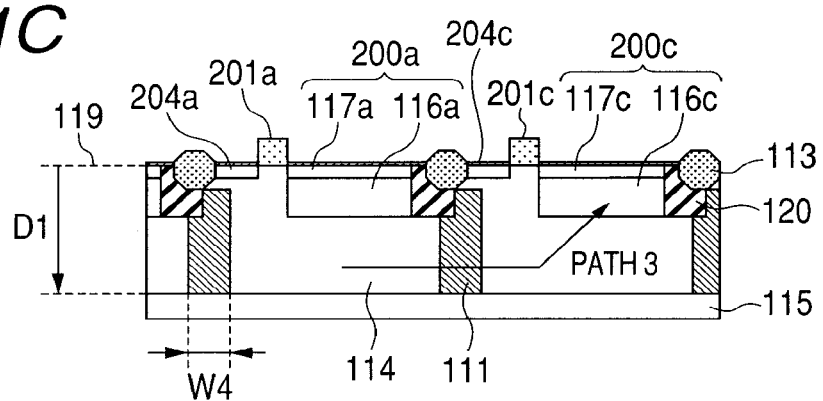
FIG. 1C is a schematic sectional view of the photoelectric conversion apparatus of the first exemplary embodiment.

The configuration in FIG. 1A is further described using FIGS. 1B and 1C. FIGS. 1B and 1C are schematic sectional views of FIG. 1A taken along XX' and YY' lines, respectively. In FIGS. 1B and 1C, elements with the same configurations are assigned with the same symbols, and the description thereof is omitted. In FIGS. 1B and 1C, there are a first conductive substrate 115, a first conductive type semiconductor region 114 and a plane 119 including a light receiving surface of the photoelectric conversion element. Here, the conductive type of the substrate 115 is arbitrary. The semiconductor region 114 may be the second conductive type, a layer formed on the substrate 115 by epitaxial growth, or a layer formed by ion implementation into the substrate 115. With reference to the plane 119, a direction toward the substrate 115 is a depth direction at the substrate. In FIGS. 1B and 1C, the element isolation region 210 includes a LOCOS structure 113. In FIGS. 1B and 1C, the photoelectric conversion element 200 includes a second conductive type (N type) charge accumulation region 116 and a P type surface protective layer 117 arranged on a side of the light receiving surface 119 of the photoelectric conversion element.

In FIG. 1C, the second semiconductor region 111 has the width W4 and a depth D1. In the sectional view of FIG. 1B, the third semiconductor region 112 has the width W3 and the depth D1. The first semiconductor region 110 arranged in the first region 213 has a configuration with the width W3 and the depth D1. In this exemplary embodiment, the widths and the depths of the first semiconductor region 110 and the third semiconductor region 112 arranged in the first region 213 are set identical to each other. The impurity concentration of the third semiconductor region is set lower than the impurity concentrations of the first and second semiconductor regions. The impurity concentration of the third semiconductor region 112 can appropriately be set by means of the layout of the photoelectric conversion apparatus and the widths W3 and W4 of the first semiconductor region.

Figure 3A:
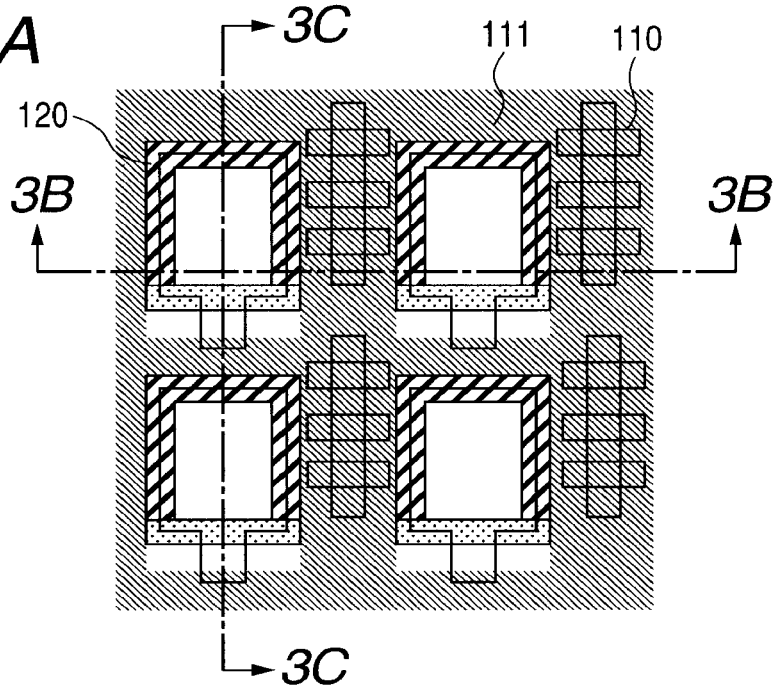
FIG. 3A is a plan view for illustrating the photoelectric conversion apparatus of the first exemplary embodiment.
Figure 3B:
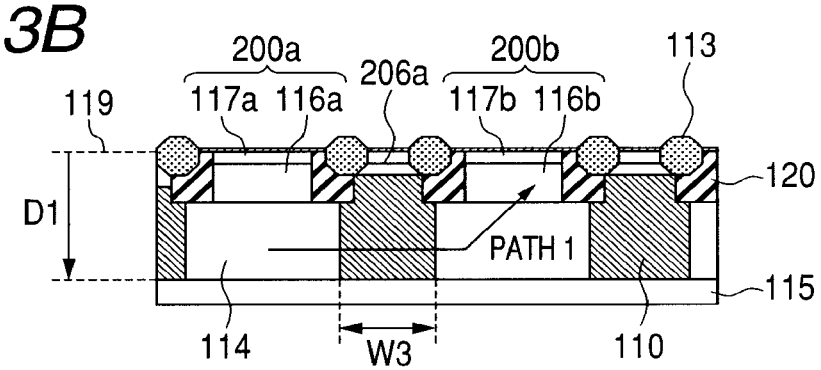
FIG. 3B is a schematic sectional view for illustrating the photoelectric conversion apparatus of the first exemplary embodiment.
Figure 3C:
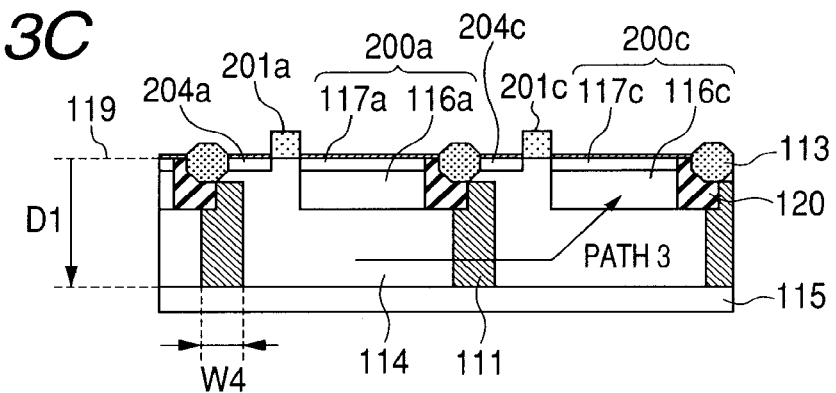
FIG. 3C is a schematic sectional view for illustrating the photoelectric conversion apparatus of the first exemplary embodiment.

Here, a flow of the signal charges is described using FIGS. 3A to 3C. FIGS. 3A to 3C are figures corresponding to FIGS. 1A to 1C, and based on FIG. 2B as with FIG. 1A. In FIGS. 3A to 3C, same elements as those in FIGS. 1A to 1C or FIG. 2B are assigned with the same symbols, and the description thereof is omitted. The third semiconductor region provided in FIGS. 1A to 1C is not provided in FIGS. 3A to 3C. The first semiconductor region 110 and the second semiconductor region 111 are provided in FIGS. 3A to 3C. In such a configuration, when the signal charges flow into the adjacent photoelectric conversion elements, the charges flow via the path 2 with the width W3 passing through the first semiconductor region 110, and via the path 3 with the width W4 passing through the second semiconductor region 111. Here, since the first semiconductor region 110 and the second semiconductor region 111 have the same impurity concentration and the same depth, the probability that the signal charges flow into the adjacent photoelectric conversion elements via the path 3 are higher than that via the path 2. Accordingly, even in the adjacent photoelectric conversion element, a mixing amount of signal charge generated in the photoelectric conversion element 200a is larger in the photoelectric conversion element 200c than that in photoelectric conversion element 200b, thereby causing unevenness. That is, in a monochrome photoelectric conversion apparatus, unevenness occurs in image quality. In a single panel color photoelectric conversion apparatus for a camera, the adjacent photoelectric conversion element generates a different color signal, thereby causing cross talk (color mixture).

On the other hand, according to the configuration illustrated in FIGS. 1A to 1C, since the third semiconductor region with the low impurity concentration is provided, the path 1 is formed. The signal charges are more likely to flow into the adjacent photoelectric conversion element through the path 1 than the path 2. The mixing amount of signal charge to the adjacent photoelectric conversion element that becomes uneven owing to the paths 2 and a path 3 can be adjusted even by the path 1. Here, likelihood of flowing of the signal charges into the adjacent photoelectric conversion element is determined according to the height of the potential with respect to the signal charge, i.e. the height of the potential barrier. Here, the potential barrier of the path 3 is lower than the potential barrier of the path 2. The potential barrier of the path 1 is lower than the potential barrier of the path 3. That is, if there is a semiconductor region with a different width functioning as a potential barrier between the photoelectric conversion elements, a part of the potential barrier with a wider width is made to have a lower potential barrier. Accordingly, the mixing amount of the signal charge can be equalized.

In this exemplary embodiment, the third semiconductor region 112 with the low impurity concentration is arranged in at least one part between the photoelectric conversion elements where the semiconductor region with a wide width is arranged. According to such a configuration, the charges to flow from the photoelectric conversion element 200a into the adjacent photoelectric conversion element can be suppressed. Further, the amount of charge flowing from the photoelectric conversion element 200a into the photoelectric conversion elements 200b and 200c can be equalized. At least one part between the photoelectric conversion elements where the semiconductor region with the wide width is arranged may be a part of the semiconductor region with the wide width. That is, a configuration where the third semiconductor region is formed in the first semiconductor region may be adopted.

Next, a method for manufacturing the photoelectric conversion apparatus of this exemplary embodiment is described using FIGS. 8A to 8G and 9A to 9G. FIGS. 8A to 8G are diagrams illustrating a manufacturing process using a sectional view corresponding to FIG. 1B. FIGS. 9A to 9G are diagrams illustrating the manufacturing process using a sectional view corresponding to FIG. 1C.

Figure 8A:
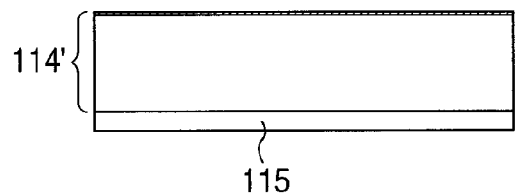
FIGS. 8A, 8B, 8C, 8D, 8E, 8F and 8G are schematic sectional views for illustrating a method for manufacturing the photoelectric conversion apparatus of the first exemplary embodiment.
Figure 8B:
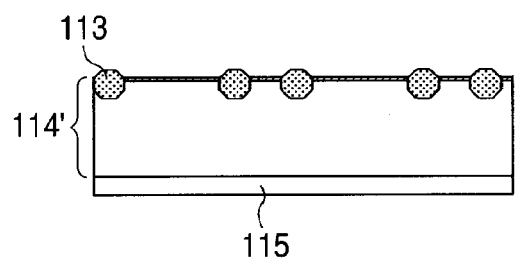
Figure 8C:
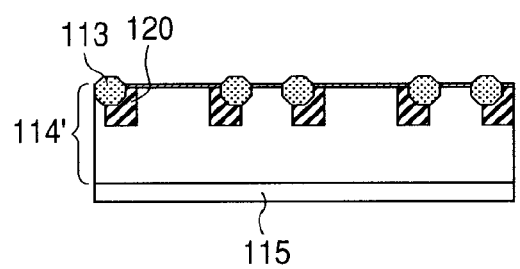
Figure 9A:
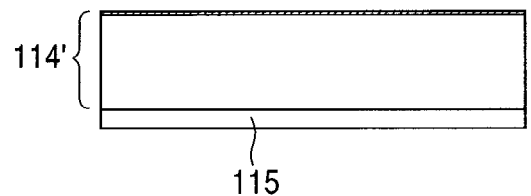
FIGS. 9A, 9B, 9C, 9D, 9E, 9F and 9G are schematic sectional views for illustrating a method for manufacturing the photoelectric conversion apparatus of the first exemplary embodiment.
Figure 9B:
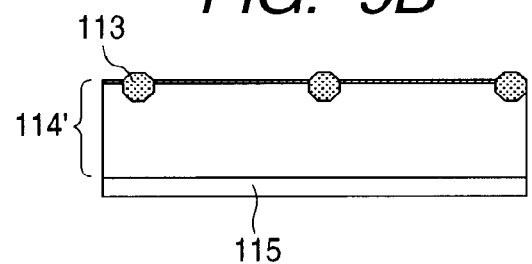
Figure 9C:
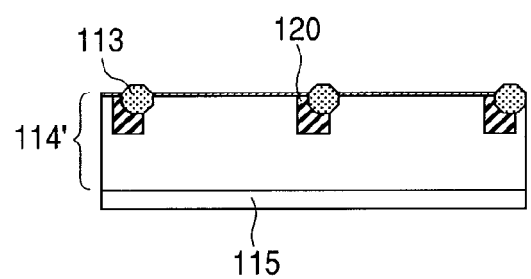

First, as illustrated in FIGS. 8A and 9A, N type epitaxial layer 114' is formed on the N type substrate 115. Next, LOCOS 113 is formed and the active region is formed (FIGS. 8B and 9B). In FIGS. 8C and 9C, ion implementation is performed using a photoresist mask, and a P type fourth semiconductor region 120 is formed at an end of the LOCOS 113.

Figure 8D:
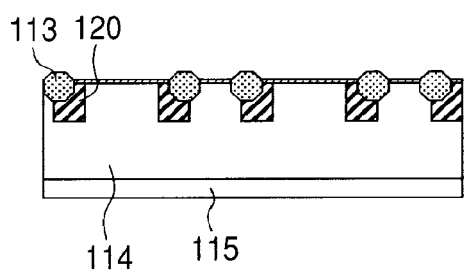
Figure 8E:
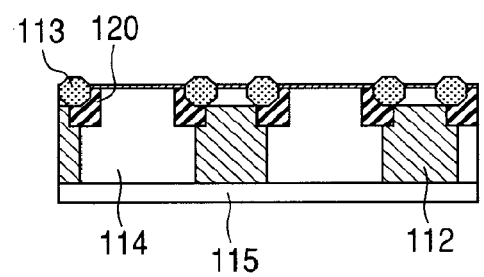
Figure 9D:
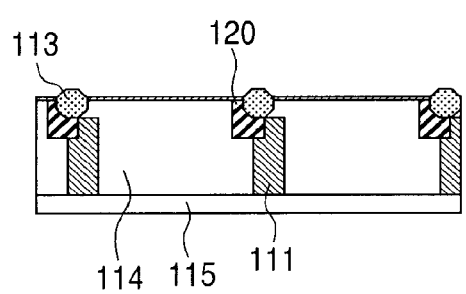
Figure 9E:
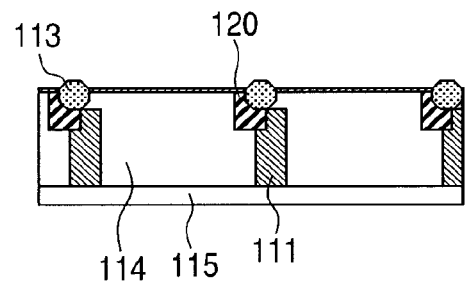

Next, ion implementation of a desired amount of dose is performed using a photoresist mask, and the P type first semiconductor region 110 and the second semiconductor region 111 are formed (FIGS. 8D and 9D). Next, ion implementation of a smaller amount of dose than that in FIGS. 8D and 9D is performed using another photoresist mask, and the P type third semiconductor region 112 is formed (FIGS. 8E and 9E).

Figure 8F:
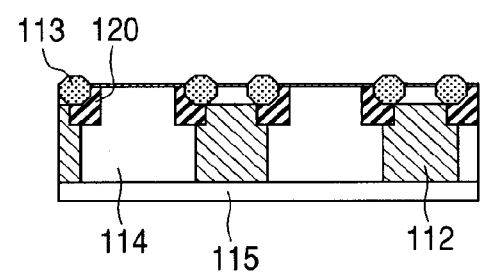
Figure 8G:
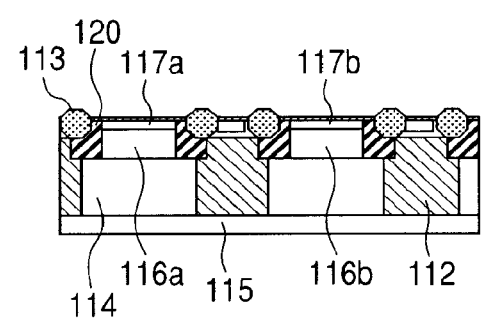
Figure 9F:
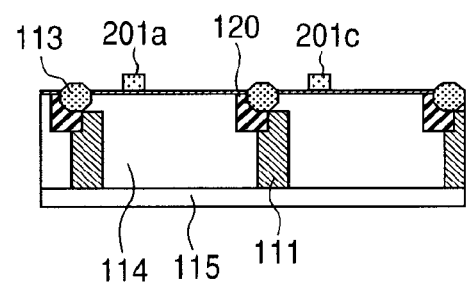
Figure 9G:
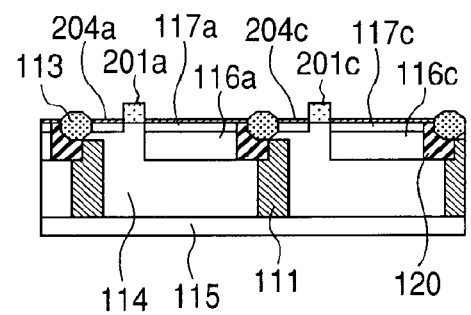

Next, the gate electrode of the transistor is formed by patterning (FIGS. 8F and 9F). Subsequently, the N type charge accumulation region 116 and the P type surface protective layer 117 of the photoelectric conversion element are formed, and the source region and the drain region of the transistor are formed (FIGS. 8G and 9G).

Subsequently, an insulating film and wirings are formed on the light receiving surface 119, and inner-layer lenses, color filters and micro lenses (not shown) are formed. Thus, the photoelectric conversion apparatus is finished.

The fourth semiconductor region 113 is arranged between the insulator of the element isolation region, or LOCOS 113 here, and the photoelectric conversion element 200, and covers the surface of the photoelectric conversion element 200. This fourth semiconductor region 113 enables mixing of dark current generated in the element isolation region into the photoelectric conversion element to be reduced.

Figure 5A:
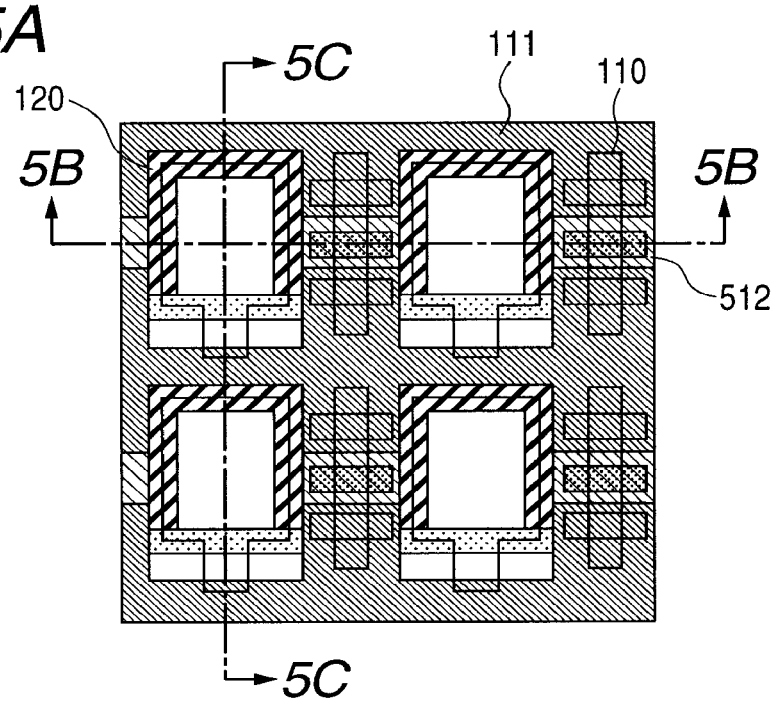
FIG. 5A is a plan view of a photoelectric conversion apparatus for illustrating a modification of the first exemplary embodiment.
Figure 5B:
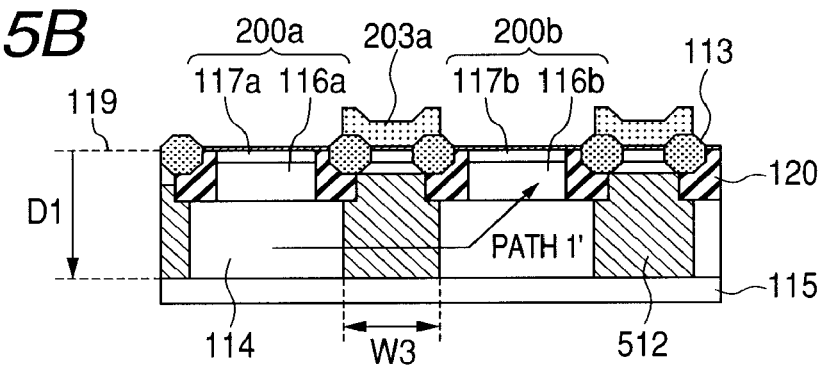
FIG. 5B is a schematic sectional view of the photoelectric conversion apparatus for illustrating the modification of the first exemplary embodiment.
Figure 5C:
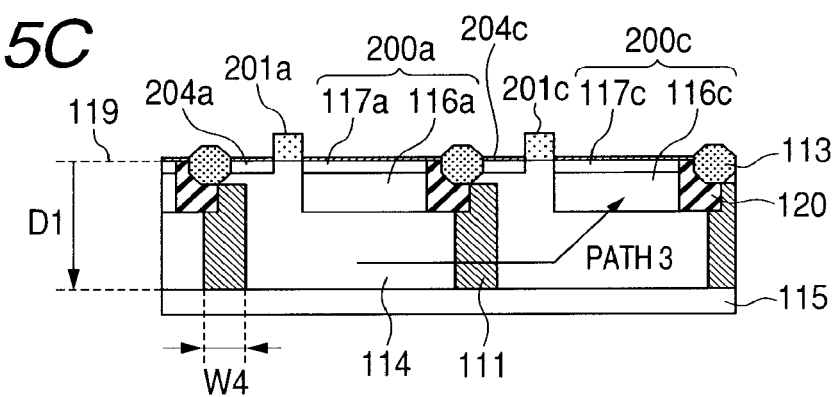
FIG. 5C is a schematic sectional view of the photoelectric conversion apparatus for illustrating the modification of the first exemplary embodiment.

As an application of this exemplary embodiment, the third semiconductor region may be provided under the gate electrode of the transistor as illustrated in FIGS. 5A to 5C. FIG. 5A corresponds to FIG. 1A. FIGS. 5B and 5C are schematic sectional views taken along the lines XX' and YY' in FIG. 5A, respectively. In FIGS. 5A, 5B and 5C, elements similar to those in FIGS. 1A to 1C are assigned with the same symbols, and the description thereof is omitted. In FIGS. 5A, 5B and 5C, the third semiconductor region 512 is provide under the gate electrode 203 of the amplifying MOS transistor, instead of the source region of the reset MOS transistor. Even with such an arrangement, the amount of charge flowing from the photoelectric conversion element 200a into the photoelectric conversion elements 200b and 200c can be equalized, while the charges to flow from the photoelectric conversion element 200a into the adjacent photoelectric conversion elements are suppressed.

In this exemplary embodiment, the third semiconductor region is provided under the source region of the reset MOS transistor. Note that, also in the source region of another transistor, the third semiconductor region may be arranged under the drain region.

Second Exemplary Embodiment

Figure 4A:
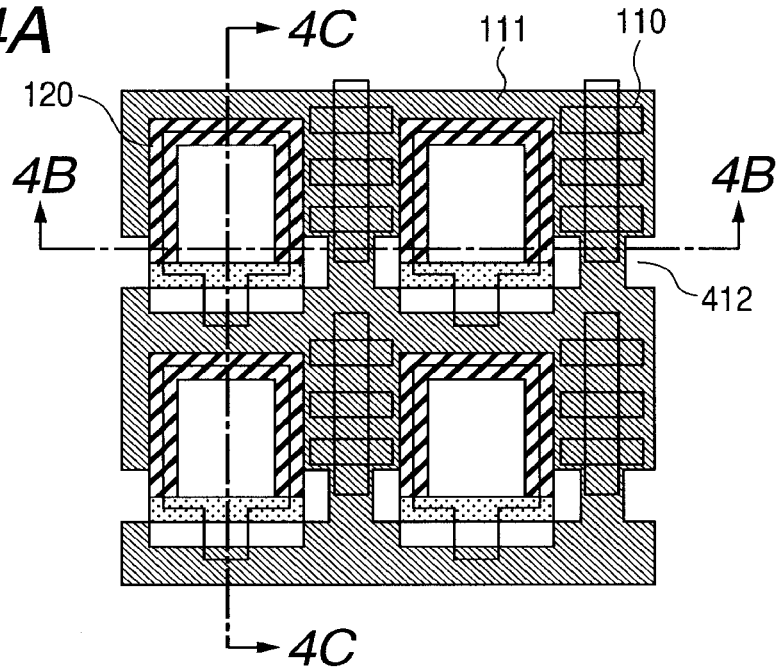
FIG. 4A is a plan view of a photoelectric conversion apparatus of a second exemplary embodiment.
Figure 4B:
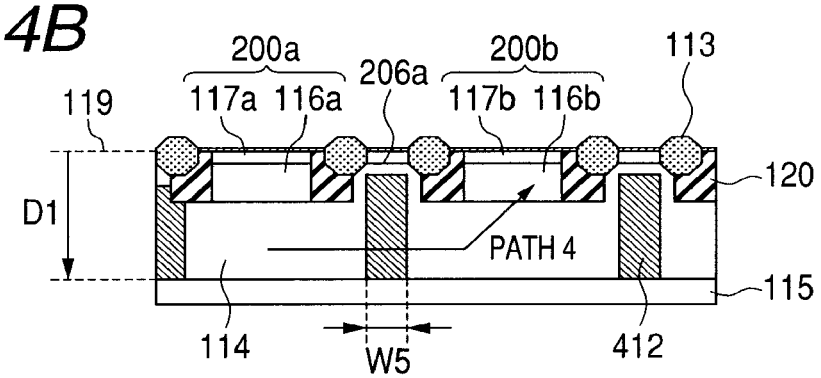
FIG. 4B is a schematic sectional view of the photoelectric conversion apparatus of the second exemplary embodiment.
Figure 4C:
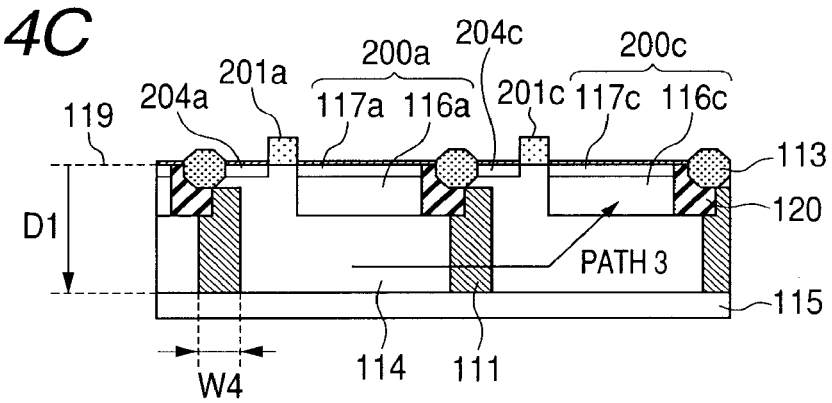
FIG. 4C is a schematic sectional view of the photoelectric conversion apparatus of the second exemplary embodiment.

A photoelectric conversion apparatus of this exemplary embodiment is described using FIGS. 4A, 4B and 4C. FIG. 4A corresponds to FIG. 1A. FIGS. 4B and 4C are schematic sectional views taken along the lines XX' and YY' in FIG. 4A, respectively. In FIGS. 4A, 4B and 4C, elements similar to those in FIGS. 1A to 1C are assigned with the same symbols, and the description thereof is omitted. Only a configuration in this exemplary embodiment different from that of the first exemplary embodiment is hereinafter described.

In the first exemplary embodiment, the part with low potential barrier is formed by the impurity concentration. On the other hand, in this exemplary embodiment, a part with low potential barrier is formed by the width of the semiconductor region forming the potential barrier. The photoelectric conversion apparatus of this exemplary embodiment includes the first semiconductor region 110 with the width W3 and the second semiconductor region 111 with the width W4, as with the first exemplary embodiment. Further, a third semiconductor region 412 of the first conductive type with a fifth width W5 narrower than the width W4 is provided. Here, the first semiconductor region 110, the second semiconductor region 111 and the third semiconductor region 412 have the same impurity concentration and the depth D1. In this exemplary embodiment, a path 4 passing through the third semiconductor region 412 is provided instead of the path 3 of the first exemplary embodiment. Accordingly, the mixing amount of signal charge to the adjacent photoelectric conversion element can evenly be adjusted.

In a case where the semiconductor region with a different width, which functions as the barrier against the signal charges, is thus provided between the photoelectric conversion elements as in FIG. 2B, the third semiconductor region 412 with the narrow width is arranged in at least a part of the region with wide width. According to such a configuration, the charges to flow from the photoelectric conversion element 200a into the adjacent photoelectric conversion elements can be suppressed. Further, according to this configuration, the amount of charge flowing from the photoelectric conversion element 200a into the photoelectric conversion element 200b and the amount of charge flowing from the photoelectric conversion element 200a into the photoelectric conversion element 200c can be equalized.

The process of forming the first to third semiconductor regions is simplified in comparison with the first exemplary embodiment. That is, provided that the shape of the photoresist mask is formed in a desired form, the first to third semiconductor regions can be formed by the same ion implementation process.

Third Exemplary Embodiment

Figure 6A:
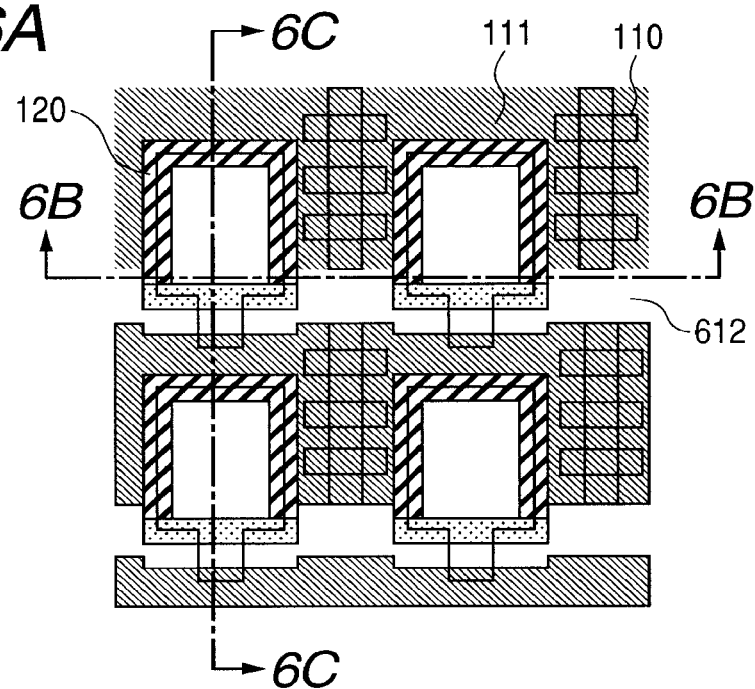
FIG. 6A is a plan view of a photoelectric conversion apparatus of a third exemplary embodiment.
Figure 6B:
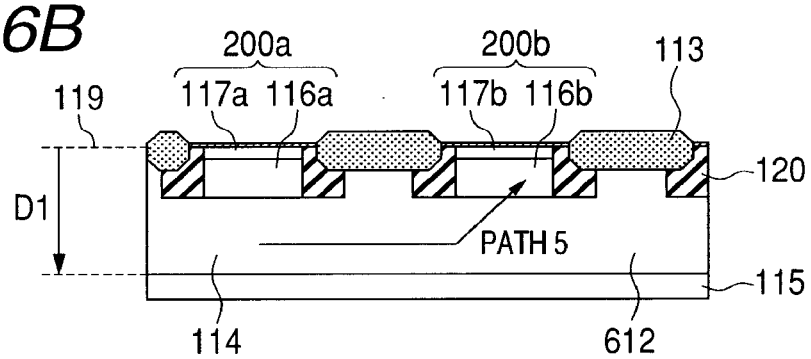
FIG. 6B is a schematic sectional view of the photoelectric conversion apparatus of the third exemplary embodiment.
Figure 6C:
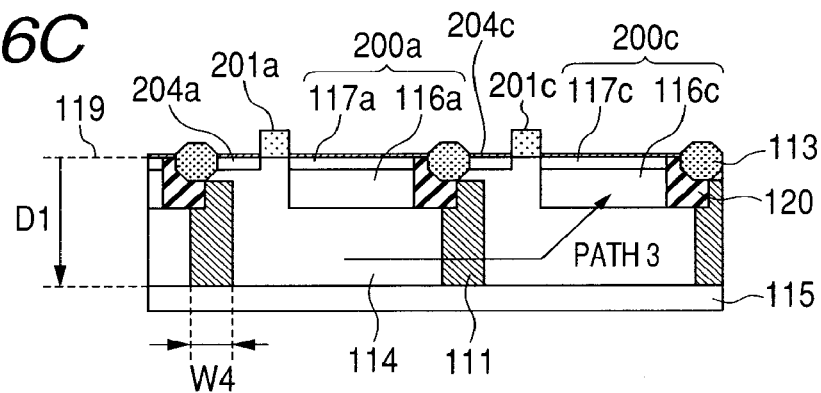
FIG. 6C is a schematic sectional view of the photoelectric conversion apparatus of the third exemplary embodiment.

A photoelectric conversion apparatus of this exemplary embodiment is described using FIGS. 6A, 6B and 6C. FIG. 6A corresponds to FIG. 1A. FIGS. 6B and 6C are schematic sectional views taken along the lines XX' and YY' in FIG. 6A, respectively. In FIGS. 6A, 6B and 6C, elements similar to those in FIGS. 1A to 1C are assigned with the same symbols, and the description thereof is omitted. Only a configuration in this exemplary embodiment different from that of the first exemplary embodiment is hereinafter described.

In the first exemplary embodiment, the part with low potential barrier is formed by the impurity concentration. On the other hand, in this exemplary embodiment, there is a part where the semiconductor region forming the potential barrier is not provided, thereby a part with low potential barrier is formed. The photoelectric conversion apparatus of this exemplary embodiment includes the first semiconductor region 110 and the second semiconductor region 111, as with the first exemplary embodiment. A third region 612 without the first conductive type semiconductor region is formed in the region 212 where the first semiconductor region 110 is arranged. Here, the first semiconductor region 110 and the second semiconductor region 111 have the same impurity concentration, and the same depth D1. As shown in FIG. 6B, a path 5 passing through the third region 612 is provided instead of the path 3 of the first exemplary embodiment. Accordingly, the mixing amount of signal charge to the adjacent photoelectric conversion element can uniformly be adjusted.

Table 1 illustrates a comparison of mixing amounts of signal charge to the adjacent photoelectric conversion elements in the configurations in FIGS. 6A to 6C and 3A to 3C. The mixing amount of signal charge from the photoelectric conversion element 200a to the photoelectric conversion element 200c is represented as a mixing amount of charge 1. The mixing amount of signal charge from the photoelectric conversion element 200a to the photoelectric conversion element 200b is represented as the mixing amount of charge 2. The unit of the mixing amounts of charge is arbitrary. As represented in Table 1, the configuration in FIGS. 6A to 6C reduces the difference between the mixing amounts of charge 1 and 2. The difference between the mixing amounts of charge 1 and 2 can further be reduced by thorough consideration in designing.

TABLE 1

|  | MIXING AMOUNT OF CHARGE 1 | MIXING AMOUNT OF CHARGE 2 |
|---|---|---|
| FIG. 6 | 100 | 95 |
| FIG. 3 | 100 | 64 |

In the case where the semiconductor region with different width functioning as the barrier against the signal charge is thus arranged between the photoelectric conversion elements as in FIG. 2B, at least a part of the semiconductor region with the wide width is chipped (not provided). According to such a configuration, the charges to flow from the photoelectric conversion element 200a to the adjacent photoelectric conversion elements can be suppressed. Further, the amount of charge flowing from the photoelectric conversion element 200a into the photoelectric conversion element 200b and the amount of charge flowing from the photoelectric conversion element 200a into the photoelectric conversion element 200c can be equalized.

Figure 7A:
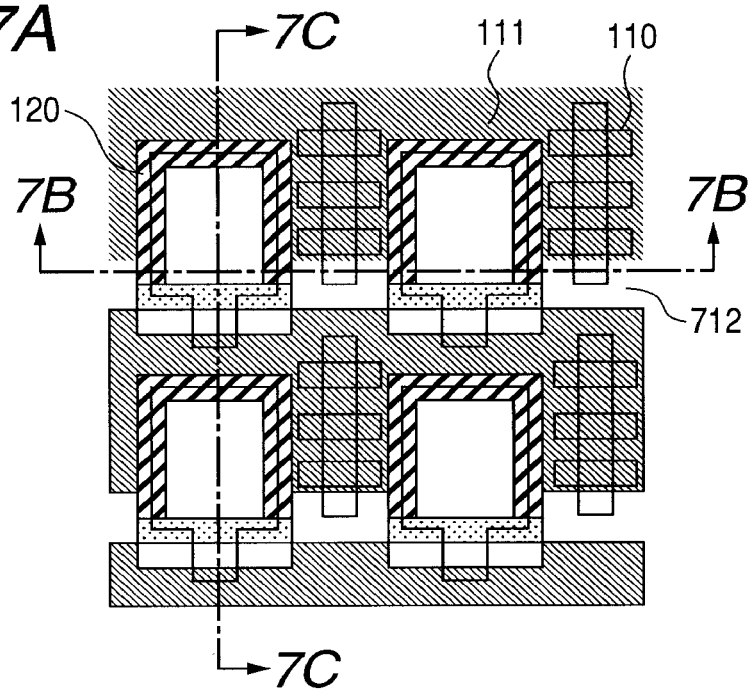
FIG. 7A is a plan view of a photoelectric conversion apparatus for illustrating a modification of the third exemplary embodiment.
Figure 7B:
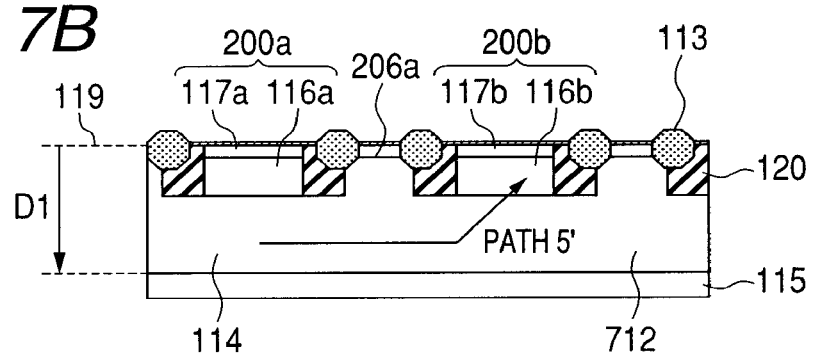
FIG. 7B is a schematic sectional view of the photoelectric conversion apparatus for illustrating the modification of the third exemplary embodiment.
Figure 7C:
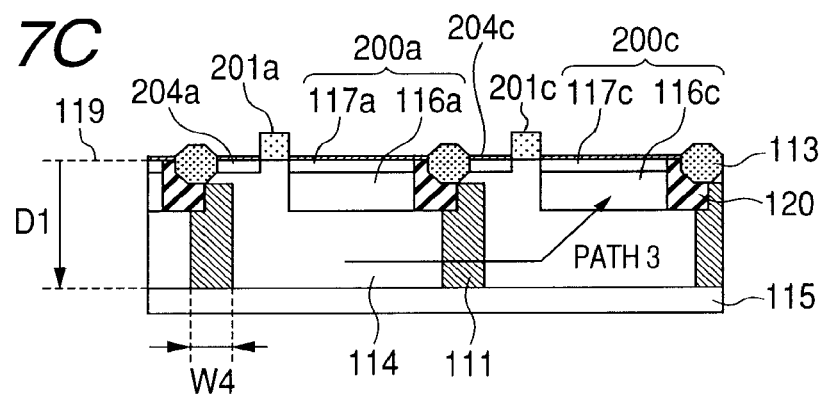
FIG. 7C is a schematic sectional view of the photoelectric conversion apparatus for illustrating the modification of the third exemplary embodiment.

As shown in FIGS. 7A to 7C, a region 712 corresponding to the region 612 may be arranged under the source region or the drain region of the transistor. In this case, the region may be arranged under the source region, the drain region or the semiconductor region to which a fixed potential, such as a power source or a ground, is supplied. This arrangement enables dark current generated in LOCOS to be drained into the source region, drain region or the semiconductor region. Accordingly, the dark current flowing into the photoelectric conversion element can be reduced.

In this exemplary embodiment, the process of forming the first and second semiconductor regions and the third region 612 is simplified in comparison with the first exemplary embodiment. That is, as to the mask pattern of the ion implementation for forming the first and second semiconductor regions, a pattern where no opening is provided in the third region 612 is used. Accordingly, the first and second semiconductor regions and the region 612 of this exemplary embodiment can be formed.

Fourth Exemplary Embodiment

Figure 10:
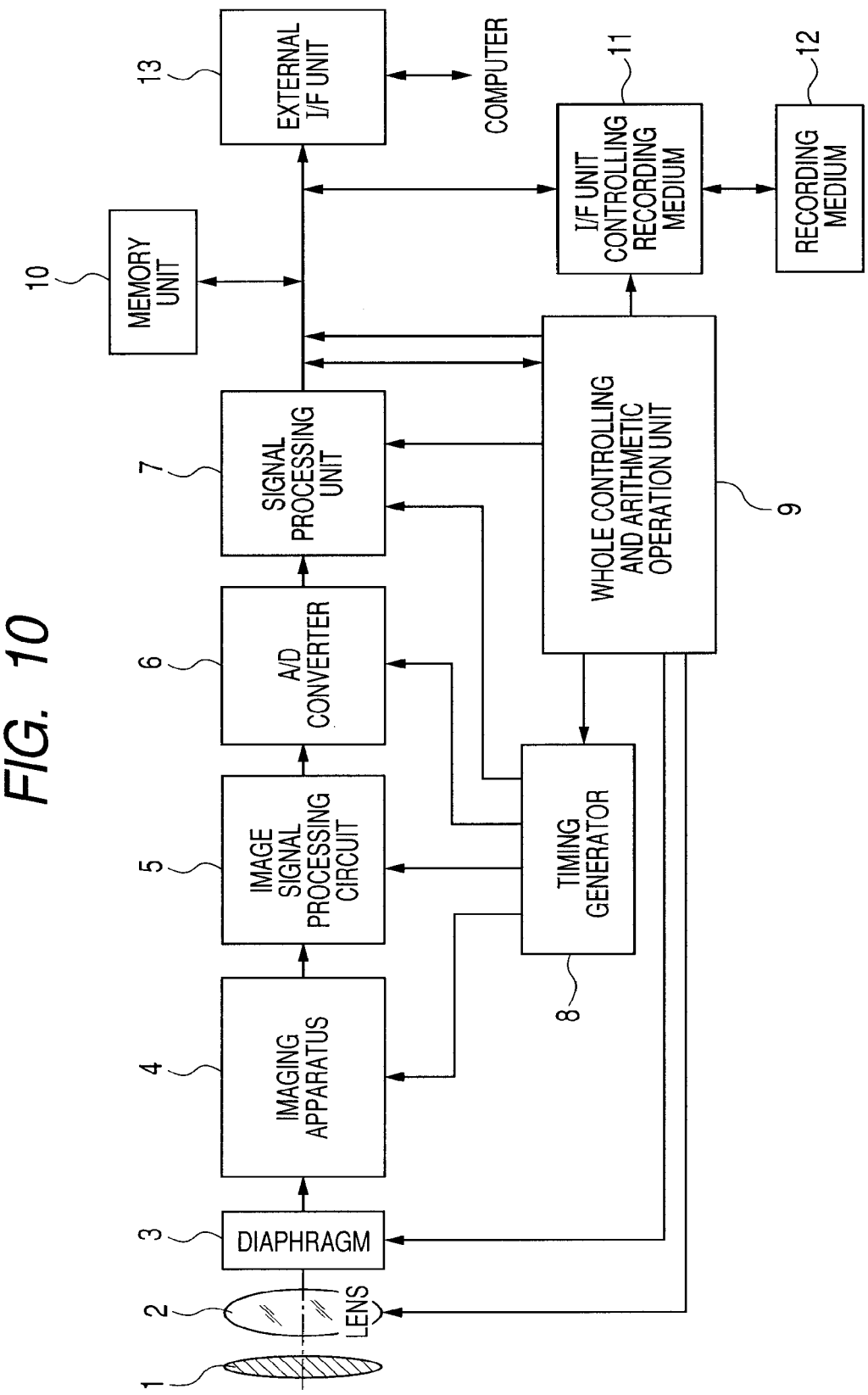
FIG. 10 is a block diagram for illustrating an imaging system.

An exemplary embodiment in a case of applying the photoelectric conversion apparatus of the present invention as an imaging apparatus to the imaging system is described in detail. The imaging systems include a digital camera, a digital camcorder and a monitor camera. FIG. 10 illustrates a block diagram in a case of applying the photoelectric conversion apparatus to the digital camera as an example of the imaging system.

In FIG. 10, the system includes a barrier 1 for protecting a lens, a lens 2 forming an optical image of a subject at the imaging apparatus 4 (photoelectric conversion apparatus), and a diaphragm 3 for changing the amount of light passing through the lens 2. The system also includes an A/D converter 6 performing analog/digital conversion on image signal output from the imaging apparatus 4, and a signal processing unit 7 applying various corrections to the image data output from the A/D converter 6 and compressing the same data. In FIG. 10, the system further includes a timing generator 8 outputting various timing signals to the imaging apparatus 4, the image signal processing circuit 5, the A/D converter 6 and the signal processing unit 7. The system includes a whole controlling and arithmetic operation unit 9 that performs various operations and totally controls the digital camera. The system includes a memory unit 10 for temporarily storing the image data, an interface 11 for recording and reading a data on or from the recording medium, and a detachable recording medium 12, such as a semiconductor memory, for recording and reading the image data. Further, the system includes an interface 13 for communicating with an external computer. Here, the timing signal may be input from the outside. The imaging system may include at least the imaging apparatus 4 and the signal processing unit 7 processing the image signal output from the imaging apparatus. The timing generator or the A/D converter may be formed on the same substrate as that of the imaging apparatus. As described above, the photoelectric conversion apparatus of the present invention may be applied to the imaging system. A high quality image can be acquired by applying the photoelectric conversion apparatus of the present invention to the imaging system.

Fifth Exemplary Embodiment

Figure 11A:
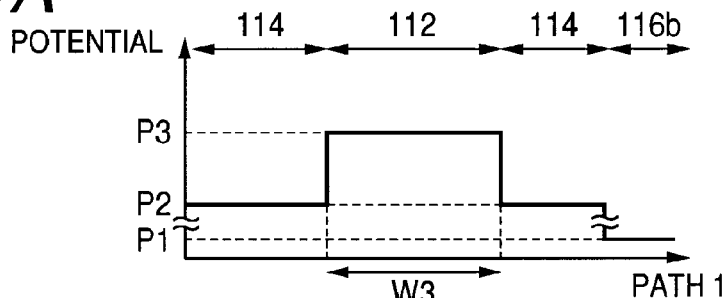
FIGS. 11A, 11B, 11C, 11D and 11E are potential diagrams illustrating a potential of a path according to a fifth exemplary embodiment.
Figure 11B:
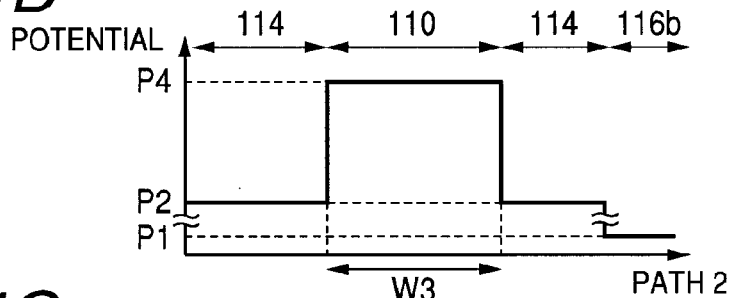
Figure 11C:
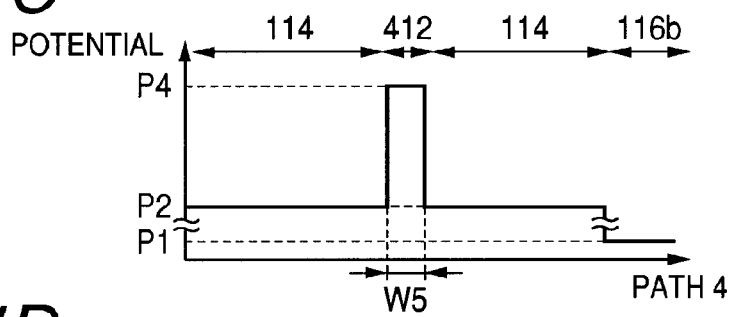
Figure 11D:
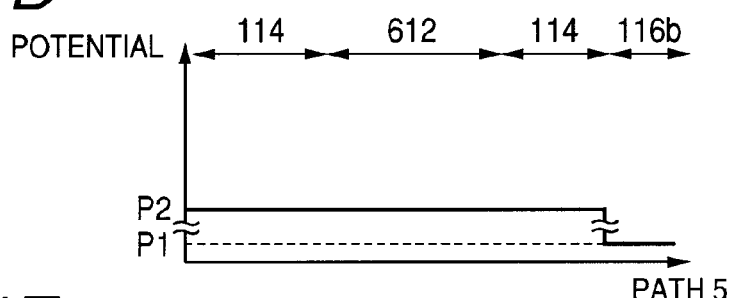
Figure 11E:
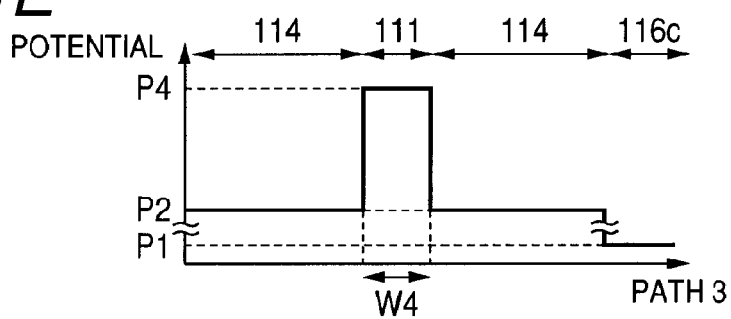

Herein, referring to FIGS. 11A to 11E, potential configuration in each path is described as follow. FIG. 11A illustrates schematically a potential configuration as to a signal charge (electron herein) in the path 1 in FIG. 1B. FIG. 11B illustrates schematically a potential configuration as to the signal charge in the path 2 in FIG. 3B. FIG. 11C illustrates schematically a potential configuration as to the signal charge in the path 4 in FIG. 4B. FIG. 11D illustrates schematically a potential configuration as to the signal charge in the path 5 in FIG. 6B. FIG.

11E illustrates schematically a potential configuration as to the signal charge in the path 3 in FIG. 1C.

Firstly, in the path 1 in FIG. 11A, a potential P1 in the charge accumulation region 116 of N type semiconductor region is at a lowest state as to the electron. A potential P2 in the semiconductor region 114 of P type is higher than the potential P1. A potential P3 in the third semiconductor region 112 of the width W3 is higher than the potential P2.

In the path 2 in FIG. 11B, a potential P4 in the first semiconductor region 110 of the width W3 is higher than the potential P3. Thus, rather than the potential of the first semiconductor region 110, the potential of the third semiconductor region 112 is lower.

In the path 3 in FIG. 11D, the second semiconductor region 111 of the width W4 narrower than W3 is at the potential P4. Herein, comparing the path 2 with the path 3, the first semiconductor region 110 in the path 2 is at the same potential 4 as the potential of the second semiconductor region 111 in the path 3. However, the first semiconductor region 110 in the path 2 has the width W3 broader than the width of the second semiconductor region 111 in the path 3. Accordingly, the signal charge is hardly transported through or over the path 2 rather than the path 3. Next, comparing the path 1 with the path 2, the third semiconductor region 112 in the path 1 has the same width W3 as that of the first semiconductor region 110 in the path 2. However, the third semiconductor region 112 in the path 1 is at the potential P3 lower than the potential of the first semiconductor region 110 in the path 2. Accordingly, the signal charge is easily transported through or over the path 1 rather than the path 2. At that state, by means of a configuration that the first region has at a part thereof a lower potential region such as the path 1, for example a configuration such that a part of the first semiconductor region 110 is replaced with the third semiconductor region 112, a quantity of mixing of the signal charge can be adjusted. In particular, comparing the third semiconductor region 112 of the width W3 and the potential P3 with the second semiconductor region 111 of the width W4 and the potential P4, it would be advantageous to set the impurity concentration and with of the semiconductor regions such that the signal charge can easily be transported through the third semiconductor region 112 rather than the second semiconductor region 111.

Next, in the path 4 in FIG. 11C, the third semiconductor region 412 has a width W5 narrower than the width W4, and is at the potential P4. Herein, comparing the path 2 with the path 4, the first semiconductor region 110 in the path 2 is at the same potential P4 as that of the third semiconductor region 412 in the path 4. However, the first semiconductor region 110 in the path 2 has a width W3 broader than that of the third semiconductor region 412 in the path 4. That is, the signal charge is easily transported through or over the path 4 rather than the path 2. Moreover, comparing the path 4 with the path 3, the third semiconductor region 412 in the path 4 is at the same potential P4 as that of the second semiconductor region 111 in the path 3. However, the third semiconductor region 412 in the path 4 has the width W5 narrower than that of the second semiconductor region 111 in the path 3. Accordingly, the signal charge is easily transported through or over the path 4 rather than the path 3. By means of such configuration that the path 4 is a part of the first region, that is, the first semiconductor region 110 is partially replaced with the third semiconductor region 412, the quantity of mixing the signal charge can be adjusted.

Referring to FIG. 11D, comparing the path 5 with the path 2, the first semiconductor region 110 in the path is at the potential P4. While, the third semiconductor region 612 in the path 5 is at the potential P2. Accordingly, the signal charge is easily transported through the path 5 rather than the path 2. Next, comparing the path 5 with the path 3, the second semiconductor region 111 in the path 3 is at the potential P4. While, the third semiconductor region 612 in the path 5 is at the potential P2. Accordingly, the signal charge is easily transported through the path 5 rather than the path 3. By means of a configuration such that the path 5 is a part of the first region, that is, the first semiconductor region 110 is partially replaced with the third semiconductor region 612, the quantity of mixing the signal charge can be adjusted.

As described above, in the case of arranging the semiconductor region with a different width functioning as a barrier (potential barrier) against the signal charges between the photoelectric conversion elements, the barrier at least one part of the semiconductor region with the wide width is made to be low. This configuration can suppress that the signal charges generated in a certain photoelectric conversion element are unevenly mixed into any photoelectric conversion element among the adjacent photoelectric conversion elements.

Here, the configuration reducing a part of potential is a configuration where a part of impurity concentration of the semiconductor region functioning as a barrier is reduced, the width is narrowed or the depth is reduced, or a configuration where a part of the semiconductor region functioning as the barrier is not provided. These configurations and each exemplary embodiment may appropriately be combined. An appropriate design can be made by estimating a balance of amounts of flow into the adjacent photoelectric conversion elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-219218, filed Sep. 24, 2009, and Japanese Patent Application No. 2010-185290 filed Aug. 20, 2010, which are hereby incorporated by reference herein in their entirety.

What is claimed is:

1. A photoelectric conversion apparatus comprising:
a first photoelectric conversion element having a semiconductor region of a first conductivity type capable of accumulating a signal charge;
a second photoelectric conversion element adjacent to the first photoelectric conversion element along a first direction, the second photoelectric conversion element having a semiconductor region of the first conductivity type;
a third photoelectric conversion element adjacent to the first photoelectric conversion element along a second direction that crosses the first direction, the third photoelectric conversion element having a semiconductor region of the first conductivity type;
a first semiconductor region of a second conductivity type opposite to the first conductivity type arranged between the semiconductor region of the first conductivity type of the first photoelectric conversion element and the semiconductor region of the first conductivity type of the second photoelectric conversion element, the first semiconductor region having a first width;
a second semiconductor region of the second conductivity type arranged between the semiconductor region of the first conductivity type of the first photoelectric conversion element and the semiconductor region of the first conductivity type of the third photoelectric conversion element, the second semiconductor region having a second width narrower than the first width; and a third semiconductor region arranged adjacent to the first semiconductor region along a third direction crossing the first direction, and arranged between the semiconductor region of the first conductivity type of the first photoelectric conversion element and the semiconductor region of the first conductivity type of the second photoelectric conversion element, the third semiconductor region having a potential for the signal charge lower than that of the first semiconductor region.

2. The photoelectric conversion apparatus according to claim 1, wherein the first and second directions are orthogonal to each other.

3. The photoelectric conversion apparatus according to claim 1, wherein the third semiconductor region has the second conductivity type.

4. The photoelectric conversion apparatus according to claim 3, wherein the third semiconductor region has a third width narrower than the second width.

5. The photoelectric conversion apparatus according to claim 3, wherein the third semiconductor region has an impurity concentration lower than an impurity concentration of the second semiconductor region.

6. The photoelectric conversion apparatus according to claim 3, wherein the third semiconductor region is arranged at a depth shallower than a depth of the second semiconductor region.

7. The photoelectric conversion apparatus according to claim 3, wherein the third and fourth semiconductor regions form a continuous semiconductor region.

8. The photoelectric conversion apparatus according to claim 1, further comprising:
a fourth semiconductor region, in which the semiconductor region of the first conductivity type of the first photoelectric conversion element, the semiconductor region of the first conductivity type of the second photoelectric conversion element, the second semiconductor region and the third semiconductor region are arranged.

9. The photoelectric conversion apparatus according to claim 1, further comprising:
color filters each arranged correspondingly to each of the first, second and third photoelectric conversion elements, wherein the color filter corresponding to the first photoelectric conversion element has a color that is different from the colors of the color filters corresponding to the second and third photoelectric conversion elements.

10. An imaging system comprising:
a photoelectric conversion apparatus according to claim 1; and
a signal processing circuit configured to process a signal outputted from the photoelectric conversion apparatus.

11. The photoelectric conversion apparatus according to claim 1, further comprising a transistor, wherein at least a part of the transistor is arranged in the first semiconductor region.

12. The photoelectric conversion apparatus according to claim 1, further comprising a transistor, wherein at least a part of the transistor is arranged in the third semiconductor region.

13. The photoelectric conversion apparatus according to claim 1, wherein the first semiconductor region, the second semiconductor region and the third semiconductor region form a grid-like configuration in a planar view.

14. The photoelectric conversion apparatus according to claim 1, wherein the third semiconductor region extends from the semiconductor region of the first conductivity type of the first photoelectric conversion element to the semiconductor region of the first conductivity type of the second photoelectric conversion element.

15. A photoelectric conversion apparatus comprising:
a semiconductor substrate;
a first photoelectric conversion element, including a semiconductor region of a first conductivity type capable of accumulating a signal charge, the semiconductor region formed in the semiconductor substrate;
a second photoelectric conversion element adjacent to the first photoelectric conversion element along a first direction, including a semiconductor region of the first conductivity type, the semiconductor region formed in the semiconductor substrate;
a third photoelectric conversion element adjacent to the first photoelectric conversion element along a second direction different from the first direction, including a semiconductor region of the first conductivity type, the semiconductor region formed in the semiconductor region formed in the semiconductor substrate;
a first semiconductor region of a second conductivity type opposite to the first conductivity type formed in the semiconductor substrate, arranged between the semiconductor region of the first conductivity type of the first photoelectric conversion element and the semiconductor region of the first conductivity type of the second photoelectric conversion element, the first semiconductor region having a first width;
a second semiconductor region of the second conductivity type formed in the semiconductor substrate, arranged between the semiconductor region of the first conductivity type of the first photoelectric conversion element and the semiconductor region of the first conductivity type of the third photoelectric conversion element, the second semiconductor region having a second width narrower than the first width; and
a portion for a charge path between the semiconductor region of the first conductivity type of the first photoelectric conversion element and the semiconductor region of the first conductivity type of the second photoelectric conversion element, the portion being arranged adjacent to the first semiconductor region along a direction across the first direction, the portion extending from the semiconductor region of the first conductivity type of the first photoelectric conversion element to the semiconductor region of the first conductivity type of the second photoelectric conversion element.

16. The photoelectric conversion apparatus according to claim 15, wherein the first and second directions are orthogonal to each other.

17. The photoelectric conversion apparatus according to claim 15, further comprising:
color filters each arranged correspondingly to each of the first, second and third photoelectric conversion elements, wherein the color filter corresponding to the first photoelectric conversion element has a color that is different from the colors of the color filters corresponding to the second and third photoelectric conversion elements.

18. An imaging system comprising:
a photoelectric conversion apparatus according to claim 15; and
a signal processing circuit configured to process a signal outputted from the photoelectric conversion apparatus.

19. The photoelectric conversion apparatus according to claim 15, further comprising a transistor, wherein at least a part of the transistor is arranged in the first semiconductor region.

20. The photoelectric conversion apparatus according to claim 15, further comprising a transistor, wherein at least a part of the transistor is arranged in the portion.

21. The photoelectric conversion apparatus according to claim 15, wherein the first semiconductor region, the second semiconductor region and the third semiconductor region form a grid-like configuration in a planar view.

22. A photoelectric conversion apparatus comprising:
a first photoelectric conversion element having a semiconductor region of a first conductivity type capable of accumulating a signal charge;
a second photoelectric conversion element adjacent to the first photoelectric conversion element along a first direction, the second photoelectric conversion element having a semiconductor region of the first conductivity type;
a third photoelectric conversion element adjacent to the first photoelectric conversion element along a second direction that crosses the first direction, the third photoelectric conversion element having a semiconductor region of the first conductivity type;
a first semiconductor region of a second conductivity type opposite to the first conductivity type arranged between the semiconductor region of the first conductivity type of the first photoelectric conversion element and the semiconductor region of the first conductivity type of the second photoelectric conversion element, the first semiconductor region having a first width;
a second semiconductor region of the second conductivity type arranged between the semiconductor region of the first conductivity type of the first photoelectric conversion element and the semiconductor region of the first conductivity type of the third photoelectric conversion element, the second semiconductor region having a second width narrower than the first width; and
a third semiconductor region of the second conductivity type arranged adjacent to the first semiconductor region along a third direction crossing the first direction, and arranged between the semiconductor region of the first conductivity type of the first photoelectric conversion element and the semiconductor region of the first conductivity type of the second photoelectric conversion element, the third semiconductor region having an impurity concentration lower than an impurity concentration of the second semiconductor region.

23. The photoelectric conversion apparatus according to claim 22, wherein in planar layout, the semiconductor region of the first conductivity type of the first photoelectric conversion element is surrounded by the first semiconductor region, the second semiconductor region, and the third semiconductor region.

24. The photoelectric conversion apparatus according to claim 22, wherein, in planar layout, the semiconductor region of the first conductivity type of the first photoelectric conversion element has a first side and a second side crossing the first side, the first semiconductor region and the third semiconductor region are arranged along the first side, and the second semiconductor region is arranged along the second side.

25. The photoelectric conversion apparatus according to claim 22, further comprising a transistor, wherein at least a part of the transistor is arranged in the first semiconductor region.

26. The photoelectric conversion apparatus according to claim 22, further comprising a transistor, wherein at least a part of the transistor is arranged in the third semiconductor region.

27. The photoelectric conversion apparatus according to claim 22, wherein the first semiconductor region, the second semiconductor region and the third semiconductor region form a grid-like shape in a planar view.

28. The photoelectric conversion apparatus according to claim 22, wherein the third semiconductor region extends from the semiconductor region of the first conductivity type of the first photoelectric conversion element to the semiconductor region of the first conductivity type of the second photoelectric conversion element.

* * * * *